(12) United States Patent
Song

(10) Patent No.: US 12,422,499 B2
(45) Date of Patent: Sep. 23, 2025

(54) BATTERY MANAGEMENT APPARATUS AND METHOD

(71) Applicant: LG ENERGY SOLUTION, LTD., Seoul (KR)

(72) Inventor: Yee-Gahng Song, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 182 days.

(21) Appl. No.: 18/007,585

(22) PCT Filed: Jan. 13, 2022

(86) PCT No.: PCT/KR2022/000687
§ 371 (c)(1),
(2) Date: Dec. 1, 2022

(87) PCT Pub. No.: WO2022/154545
PCT Pub. Date: Jul. 21, 2022

(65) Prior Publication Data
US 2023/0213589 A1    Jul. 6, 2023

(30) Foreign Application Priority Data

Jan. 13, 2021  (KR) .......... 10-2021-0004852

(51) Int. Cl.
*G01R 31/396*  (2019.01)
*H02J 7/00*  (2006.01)

(52) U.S. Cl.
CPC .......... *G01R 31/396* (2019.01); *H02J 7/0013* (2013.01); *H02J 7/005* (2020.01)

(58) Field of Classification Search
CPC . G01R 31/367; G01R 31/396; H01M 10/425; H01M 10/48; H01M 2010/4271;
(Continued)

(56) References Cited

U.S. PATENT DOCUMENTS

2002/0011820 A1  1/2002  Suzuki et al.
2011/0200902 A1  8/2011  Araki
(Continued)

FOREIGN PATENT DOCUMENTS

CN    103399282 A    11/2013
CN    108845268 A    11/2018
(Continued)

OTHER PUBLICATIONS

International Search Report (PCT/ISA/210) issued in PCT/KR2022/000687, dated Apr. 19, 2022.
(Continued)

*Primary Examiner* — Judy Nguyen
*Assistant Examiner* — Brent J Andrews
(74) *Attorney, Agent, or Firm* — Birch, Stewart, Kolasch & Birch, LLP

(57) ABSTRACT

A battery management apparatus includes a battery information obtaining unit for obtaining a plurality of battery information for a plurality of battery cells; and a control unit for calculating a whisker for the plurality of battery information based on a criterion distribution profile for a population of the plurality of battery cells, generating a box plot for the plurality of battery cells based on the plurality of battery information and the calculated whisker, and determining a state of each of the plurality of battery cells according to whether each of the plurality of battery information is included in a threshold region corresponding to the generated box plot.

11 Claims, 3 Drawing Sheets

(58) Field of Classification Search
CPC ....... H01M 2010/4278; H01M 2220/20; H02J 7/0013; H02J 7/005; Y02E 60/10; Y02E 10/00; Y02E 20/00; Y02E 30/00; Y02E 40/00; Y02E 50/00; Y02E 60/00; Y02E 70/00
See application file for complete search history.

(56) References Cited

U.S. PATENT DOCUMENTS

| | | | |
|---|---|---|---|
| 2015/0369873 A1* | 12/2015 | Nakao | G01R 31/392 702/63 |
| 2016/0109526 A1* | 4/2016 | Geffin | G01R 31/3648 702/189 |
| 2017/0126027 A1* | 5/2017 | Park | B60L 58/22 |
| 2018/0095137 A1 | 4/2018 | Yoshioka et al. | |
| 2020/0233037 A1 | 7/2020 | Yamamoto et al. | |
| 2020/0363478 A1 | 11/2020 | Delobel et al. | |
| 2021/0156923 A1 | 5/2021 | Nam et al. | |
| 2023/0176140 A1 | 6/2023 | Song | |
| 2023/0213586 A1 | 7/2023 | Kong et al. | |

FOREIGN PATENT DOCUMENTS

| | | |
|---|---|---|
| CN | 111257755 A | 6/2020 |
| CN | 111856307 A | 10/2020 |
| JP | 3709766 B2 | 10/2005 |
| JP | 5343509 B2 | 11/2013 |
| JP | 5481974 B2 | 4/2014 |
| JP | 6279442 B2 | 2/2018 |
| JP | 2020-119712 A | 8/2020 |
| JP | 6798224 B2 | 12/2020 |
| JP | 2023-525240 A | 6/2023 |
| JP | 2023-527184 A | 6/2023 |
| KR | 10-2016-0000141 A | 1/2016 |
| KR | 20160000141 A * | 1/2016 |
| KR | 10-2019-0084686 A | 7/2019 |
| WO | WO 2019/141688 A1 | 7/2019 |

OTHER PUBLICATIONS

"Box plot," Wikipedia, Dec. 25, 2020, 8 pages total, URL: <https://en.wikipedia.org/w/index.php?title=Box_plot&oldid=996143328>.
"Interquartile range," Wikipedia, Dec. 4, 2020, 5 pages total, URL: <https://en.wikipedia.org/w/index.php?title=Interquartile_range&oldid=992136942>.
Extended European Search Report for European Application No. 22739738.7, dated Mar. 11, 2024.
Naha et al., "On-Board Short-Circuit Detection of Li-ion Batteries Undergoing Fixed Charging Profile as in Smartphone Applications," IEEE Transactions on Industrial Electronics, vol. 66, No. 11, Nov. 2019, pp. 8782-8791.
Singh et al., "Twenty Years of Near/Sub-Threshold Design Trends and Enablement," IEEE Transactions on Circuits and Systems-II: Express Briefs, vol. 68, No. 1, Jan. 2021, pp. 5-11.
Xu et al., "Early Warning of Lithium Battery Progressive Fault Based on Box Plot," 2019 3rd International Conference on Electronic Information Technology and Computer Engineering (EITCE), Oct. 18-20, 2019, pp. 1072-1075.
Yin et al., "Voltage Fault Diagnosis of Power Batteries based on Boxplots and Gini Impurity for Electric Vehicles," Electronic Vehicles International Conference & Show, EV2019, Oct. 3-4, 2019, 5 pages total.

* cited by examiner

BATTERY MANAGEMENT APPARATUS AND METHOD

TECHNICAL FIELD

The present application claims priority to Korean Patent Application No. 10-2021-0004852 filed on Jan. 13, 2021 in the Republic of Korea, the disclosures of which are incorporated herein by reference.

The present disclosure relates to a battery management apparatus and method, and more particularly, to a battery management apparatus and method capable of determining a state of each of a plurality of battery cells.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-charging rate and high energy density.

Even with the same product, the difference in electrochemical characteristics may increase due to deviation in the production process and deviation in the actual use environment after shipment. For example, a gap between batteries leads to a behavior deviation during a charging/discharging cycle, and the resulting heat generation and voltage difference may be accelerated in a non-linear manner.

Conventionally, a fixed threshold value or a fixed threshold range is set, and a battery in a non-normal state is diagnosed using the set threshold value or threshold range. However, this conventional method has a problem in that it does not reflect the degradation of the battery over time. In addition, due to the complexity of the numerical determination model for setting the threshold value or threshold range by reflecting the degradation of the battery, there is a problem that the actual implementation becomes very difficult.

DISCLOSURE

Technical Problem

The present disclosure is designed to solve the problems of the related art, and therefore the present disclosure is directed to providing a battery management apparatus and method capable of diagnosing a state of each of a plurality of battery cells currently in operation based on a normal distribution of the population.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

A battery management apparatus according to one aspect of the present disclosure may comprise: a battery information obtaining unit configured to obtain a plurality of battery information for a plurality of battery cells; and a control unit configured to calculate a whisker for the plurality of battery information based on a criterion distribution profile for a population of the plurality of battery cells, generate a box plot for the plurality of battery cells based on the plurality of battery information and the calculated whisker, and determine a state of each of the plurality of battery cells according to whether each of the plurality of battery information is included in a threshold region corresponding to the generated box plot.

The criterion distribution profile may be a profile representing a distribution pattern of the battery information for a plurality of batteries in a beginning of life (BOL) state included in the population.

The control unit may be configured to calculate the whisker based on an average value of the criterion distribution profile, a reference value corresponding to a predetermined probability density from the average value and a threshold value set to correspond to a defective rate for the population of the plurality of battery cells.

The control unit may be further configured to calculate a reference deviation between the reference value and the average value, calculate a threshold deviation between the threshold value and the reference value, and calculate the whisker based on the calculated reference deviation and the calculated threshold deviation.

The control unit may be configured to calculate the whisker using the following formula.

$$W = Td + (2 \times Rd) \qquad \text{[Formula]}$$

Here, W may be the whisker, Td may be the threshold deviation, and Rd may be the reference deviation.

The defective rate may be set to correspond to a ratio of defective cells among a plurality of cells included in the population.

The control unit may be configured to determine the state of a battery cell whose corresponding battery information is included in a threshold range of the generated box plot among the plurality of battery cells as a normal state.

The control unit may be configured to determine the state of a battery cell whose corresponding battery information is out of the threshold range of the generated box plot among the plurality of battery cells as a defective state.

The control unit may be further configured to select at least one of a top region and a bottom region included in the generated box plot according to the obtained battery information, and determine the threshold region based on the selected region.

A battery pack according to another aspect of the present disclosure may comprise the battery management apparatus according to an aspect of the present disclosure.

A battery management method according to still another aspect of the present disclosure may comprise: a battery information obtaining step of obtaining a plurality of battery information for a plurality of battery cells; a whisker calculating step of calculating a whisker for the plurality of battery information based on a criterion distribution profile for a population of the plurality of battery cells; a box plot generating step of generating a box plot for the plurality of battery cells based on the plurality of battery information and the calculated whisker; and a state determining step of determining a state of each of the plurality of battery cells according to whether each of the plurality of battery information is included in a threshold region corresponding to the generated box plot.

Advantageous Effects

According to one aspect of the present disclosure, there is an advantage that the state of each of the plurality of batteries may be diagnosed in consideration of the defective rate of the population and the current degradation state of the plurality of battery cells.

The effects of the present disclosure are not limited to the effects mentioned above, and other effects not mentioned will be clearly understood by those skilled in the art from the description of the claims.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

In addition, throughout the specification, when a portion is referred to as being "connected" to another portion, it is not limited to the case that they are "directly connected", but it also includes the case where they are "indirectly connected" with another element being interposed between them.

Hereinafter, preferred embodiments of the present disclosure will be described in detail with reference to the accompanying drawings.

Figure 1:
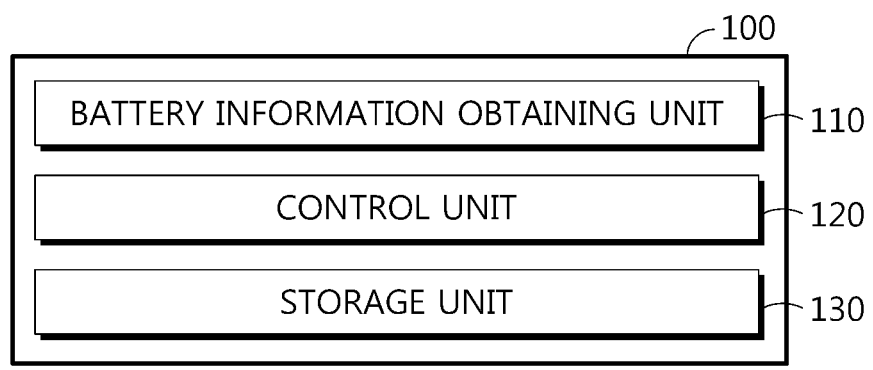
FIG. 1 is a diagram schematically showing a battery management apparatus according to an embodiment of the present disclosure.

FIG. 1 is a diagram schematically showing a battery management apparatus 100 according to an embodiment of the present disclosure.

Referring to FIG. 1, the battery management apparatus 100 may include a battery information obtaining unit 110 and a control unit 120.

The battery information obtaining unit 110 may be configured to obtain a plurality of battery information for a plurality of battery cells.

Here, the battery cell means one physically separable independent cell including a negative electrode terminal and a positive electrode terminal. For example, one lithium-ion battery or lithium polymer battery may be regarded as a battery cell.

For example, the battery information obtainable by the battery information obtaining unit 110 may include at least one of voltage, current, temperature, SOC (State of Charge), SOH (State of Health) and resistance of each of the plurality of battery cells. Specifically, the battery information obtaining unit 110 may obtain at least one of voltage, current, and temperature of each of the plurality of battery cells. In addition, the battery information obtaining unit 110 may obtain battery information such as SOC, SOH and resistance based on at least one of the obtained voltage, current and temperature.

The control unit 120 may be configured to calculate a whisker for the plurality of battery information based on a criterion distribution profile for the population of the plurality of battery cells.

Here, the criterion distribution profile may be a profile representing a continuous probability distribution of the battery information for a plurality of batteries of a BOL (Beginning of Life) state included in the population.

Specifically, the population may include a plurality of batteries including the plurality of battery cells. For example, the population may include batteries manufactured through the same production line. In addition, the population may include the plurality of battery cells. As a specific example, the number of the plurality of battery cells may be 100, and the number of the plurality of batteries included in the population may be 1,000. That is, the population (1,000 batteries) may include 100 battery cells according to an embodiment of the present disclosure and the remaining 900 battery cells.

Figure 2:
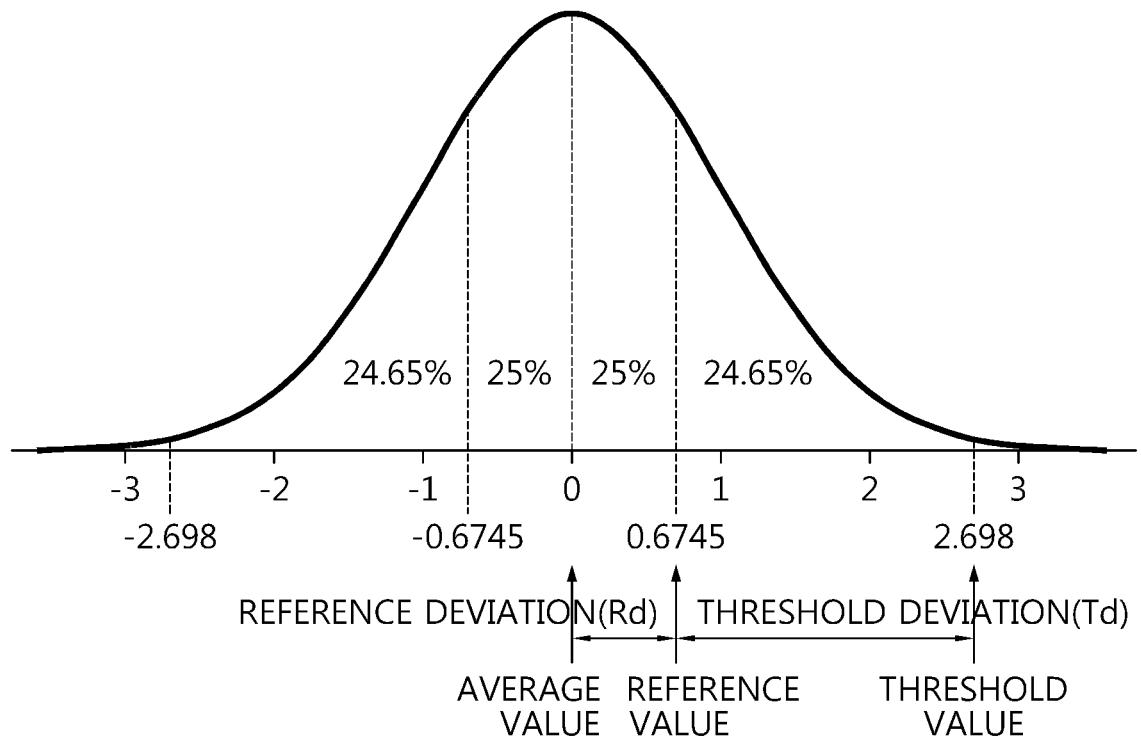
FIG. 2 is a diagram schematically showing a criterion distribution profile according to an embodiment of the present disclosure.

FIG. 2 is a diagram schematically showing a criterion distribution profile according to an embodiment of the present disclosure.

In the embodiment of FIG. 2, the criterion distribution profile for the battery in a BOL state included in the population may be a normal distribution with an average value of 0.

Specifically, the control unit 120 may be configured to calculate the whisker based on an average value of the criterion distribution profile, a reference value corresponding to a predetermined probability density from the average value, and a threshold value set to correspond to a defective rate for the population.

In the embodiment of FIG. 2, the criterion distribution profile may be a distribution profile following a normal distribution.

The reference value may be a value corresponding to a predetermined probability density (x %) based on the average value of the criterion distribution profile. For example, in the embodiment of FIG. 2, the reference value is a value corresponding to a predetermined probability density of 25%, and may be 0.6745.

Also, the defective rate may be set to correspond to a ratio of defective cells among the plurality of cells included in the population. In addition, the threshold value may be set to a value corresponding to a probability density corresponding to the defective rate. For example, in the embodiment of FIG. 2, the defective rate is a ratio of actual defective cells among the plurality of cells included in the population, and may be 0.7%. In addition, the threshold value is a value corresponding to the defective rate, and may be 2.698.

The control unit 120 may be configured to calculate a reference deviation between the reference value and the average value, calculate a threshold deviation between the threshold value and the reference value, and calculate the whisker based on the calculated reference deviation and the threshold deviation.

Specifically, the control unit 120 may be configured to calculate the whisker using the following formula.

$$W=Td \div (2 \times Rd) \quad \text{[Formula]}$$

Here, W may be the whisker, Td may be the threshold deviation, and Rd may be the reference deviation. The threshold deviation Td may be calculated according to the formula of "threshold value−reference value", and the reference deviation Rd may be calculated according to the formula of "reference value−average value".

For example, in the embodiment of FIG. 2, the reference deviation Rd may be 0.6745, which is a difference between the reference value (0.6745) and the average value (0). Also, the threshold deviation Td may be 2.024 (or 2.0235), which is a difference between the threshold value (2.698) and the reference value (0.6745). Therefore, the whisker W may be calculated as 1.5 according to the formula of "2.024÷(2× 0.6745)".

The control unit 120 may be configured to generate a box plot for the plurality of battery cells based on the plurality of battery information and the calculated whisker.

Figure 3:
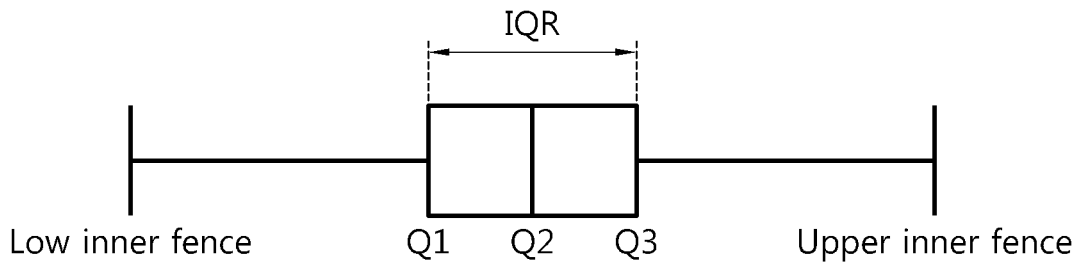
FIG. 3 is a diagram schematically showing a general box plot.

FIG. 3 is a diagram schematically showing a general box plot.

Referring to FIG. 3, the box plot may include a low inner fence, an interquartile range (IQR), and an upper inner fence. Here, the interquartile range IQR may be defined as a region range of the first quantile Q1 to the third quantile Q3.

Specifically, according to the general definition of the box plot, the low inner fence may be derived based on the interquartile range IQR and the whisker W. For example, the low inner fence may be defined as "first quantile Q1− (interquartile range IQR×whisker W)".

In addition, the upper inner fence may be derived based on the interquartile range IQR and the whisker W. For example, the upper inner fence may be defined as "third quantile Q3+(interquartile range IQR×whisker W)".

Figure 4:
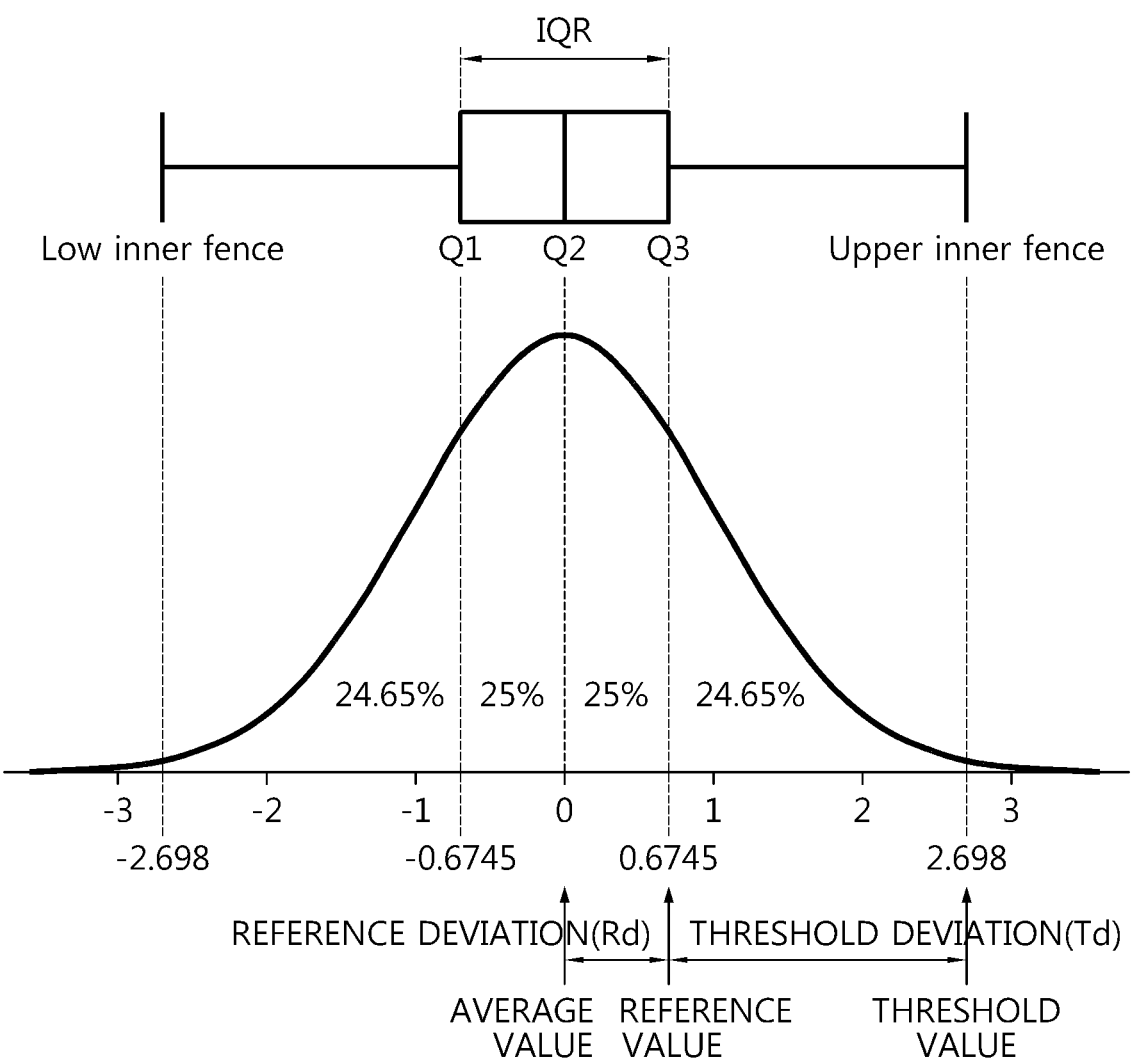
FIG. 4 is a diagram schematically showing a box plot generated based on the criterion distribution profile according to an embodiment of the present disclosure.

FIG. 4 is a diagram schematically showing a box plot generated based on the criterion distribution profile according to an embodiment of the present disclosure.

Referring to FIG. 4, the control unit 120 may calculate the whisker from the criterion distribution profile of FIG. 2. In addition, the control unit 120 may generate a box plot for the plurality of battery cells using the calculated whisker.

Preferably, the control unit 120 may generate a box plot based on a median of the plurality of battery information. That is, in the embodiment of FIG. 4, the second quantile Q2 may be set based on the median of the plurality of battery information.

Specifically, the embodiment of FIG. 4 is a diagram showing an ideal corresponding relationship between the criterion distribution profile and the box plot. Here, it should be noted that the criterion distribution profile is based on the battery information of the population, and the box plot is based on the battery information of the plurality of battery cells. That is, the box plot is generated through the whisker calculated based on the criterion distribution profile and the battery information of the plurality of battery cells, and the criterion distribution profile is not simply replaced with the box plot. Therefore, based on the ideal embodiment of FIG. 4, the criterion distribution profile for the population should not be interpreted as a simple substitution of the box plot for the plurality of battery cells.

The control unit 120 may be configured to determine the state of each of the plurality of battery cells according to whether each of the plurality of battery information is included in a threshold region corresponding to the generated box plot.

For example, the control unit 120 may be configured to determine a state of a battery cell whose corresponding battery information is included in the threshold range of the box plot among the plurality of battery cells as a normal state. Conversely, the control unit 120 may be configured to determine a state of a battery cell whose corresponding battery information is out of the threshold range of the box plot among the plurality of battery cells as a defective state.

That is, the battery management apparatus 100 according to an embodiment of the present disclosure may determine the state of the plurality of battery cells based on the criterion distribution profile of the population including the plurality of battery cells.

That is, when the number of the plurality of battery cells is small, in some cases, an ideal continuous probability distribution cannot be obtained only with the battery information for the plurality of battery cells. In this case, since the number of samples is insufficient, accuracy and reliability for determining the state of the plurality of battery cells may be low only by continuous probability distribution.

Accordingly, when the number of samples (the plurality of battery cells) is small, the battery management apparatus 100 may generate the box plot for the plurality of battery cells by calculating the whisker based on the criterion distribution profile for the population including the samples. Also, since the battery management apparatus 100 may determine the state of the plurality of battery cells based on the generated box plot, the accuracy and reliability of determining the state of the plurality of battery cells may be improved.

For example, when the number of the plurality of battery cells is 100 but the number of the population is 10,000, since the box plot for the plurality of battery cells generated by the battery management apparatus 100 is generated in consideration of the normal distribution of the population, the accuracy and reliability of determining the state of the plurality of battery cells may be improved.

In addition, since the control unit 120 calculates the whisker based on the defective rate of the population, the accuracy and reliability of determining the state of the plurality of battery cells based on the box plot may be higher.

For example, in the embodiment of FIG. 4, the defective rate of the population is 0.7%, and thus the calculated whisker may be 1.5. That is, the box plot according to the embodiment of FIG. 4 may be a box plot capable of determining the state of the plurality of battery cells included in the population based on the criterion distribution profile of the population whose defective rate is detected as 0.7%.

As the defective rate of the population increases, the whisker calculated according to the formula becomes smaller, and accordingly, the threshold region of the box plot may also be decreased. Conversely, as the defective rate of the population decreases, the whisker produced according to the formula becomes larger, and accordingly, the threshold region of the box plot may also be increased.

That is, since the battery management apparatus 100 according to an embodiment of the present disclosure may generate a box plot that can adaptively change depending on the defective rate of the population, it is possible to more accurately determine the state of the plurality of battery cells. This means that the higher the defective rate of the population, the greater the probability that the plurality of battery cells included in the population are also defective. Accordingly, the battery management apparatus 100 may probabilistically determine the state of the plurality of battery cells more accurately by considering the defective rate of the population, when determining the state of the plurality of battery cells in a MOL (Middle of Life) or EOL (End of Life) state.

Meanwhile, the control unit 120 provided in the battery management apparatus 100 may selectively include processors known in the art, application-specific integrated circuit (ASIC), other chipsets, logic circuits, registers, communication modems, data processing devices, and the like to execute various control logic performed in the present disclosure. Also, when the control logic is implemented in software, the control unit 120 may be implemented as a set of program modules. At this time, the program module may be stored in a memory and executed by the control unit 120. The memory may be located inside or out of the control unit 120 and may be connected to the control unit 120 by various well-known means.

In addition, the battery management apparatus 100 may further include a storage unit 130. The storage unit 130 may store data necessary for operation and function of each component of the battery management apparatus 100, data generated in the process of performing the operation or function, or the like. The storage unit 130 is not particularly limited in its kind as long as it is a known information storage means that can record, erase, update and read data. As an example, the information storage means may include RAM, flash memory, ROM, EEPROM, registers, and the like. In addition, the storage unit 130 may store program codes in which processes executable by the control unit 120 are defined.

For example, the storage unit 130 may store the criterion distribution profile. Also, the storage unit 130 may store the average value, the reference value, the threshold value, the reference deviation Rd, the threshold deviation Td, and the defective rate of the population based on the criterion distribution profile. The control unit 120 may access the storage unit 130 to obtain information necessary for calculating the whisker and generating the box plot.

Also, the storage unit 130 may store the battery information for the plurality of battery cells. The battery information obtaining unit 110 may obtain the battery information by accessing the storage unit 130, or may obtain the battery information by directly receiving the battery information from the outside.

The control unit 120 may be configured to select at least one of a top region and a bottom region included in the generated box plot according to the obtained battery information, and determine the threshold region based on the selected region.

The box plot may include a top region and a bottom region based on the median of the plurality of battery information. The top region may be a region including values greater than or equal to the median, and the bottom region may be a region including values less than the median.

For example, in the embodiment of FIG. 4, the top region of the box plot may correspond to a region equal to or greater than the second quantile Q2 and equal to or smaller than the upper inner fence, and the bottom region may correspond to a region less than the second quantile Q2 and equal to or greater than the low inner fence.

In general, the threshold region may be determined including both the top region and the bottom region. However, the threshold region may be determined as at least one of the top region and the bottom region according to the battery information.

For example, when the battery information is the voltage of the battery cell at a charge termination point, only the top region may be included in the threshold region to determine an overcharged battery cell as a defective state.

As another example, when the battery information is the voltage of the battery cell at a discharge termination point, only the top region may be included in the threshold region to determine an overdischarged battery cell as a defective state.

That is, the control unit 120 may prevent unnecessary system resources from being wasted in setting and storing the threshold region by determining the threshold region as at least one of the top region and the bottom region according to the battery information. In addition, since an optimized threshold region can be set according to the battery information, the control unit 120 may more quickly determine the state of the battery cell.

The battery management apparatus 100 according to the present disclosure may be applied to a BMS (Battery Management System). That is, the BMS according to the present disclosure may include the battery management apparatus 100 described above. In this configuration, at least some of the components of the battery management apparatus 100 may be implemented by supplementing or adding functions of the configuration included in the conventional BMS. For example, the battery information obtaining unit 110, the control unit 120 and the storage unit 130 may be implemented as components of the BMS.

In addition, the battery management apparatus 100 according to the present disclosure may be provided in a battery pack 1. That is, the battery pack 1 according to the present disclosure may include the above-described battery management apparatus 100 and one or more battery cells. In addition, the battery pack 1 may further include electrical equipment (relays, fuses, etc.) and a case.

Figure 5:
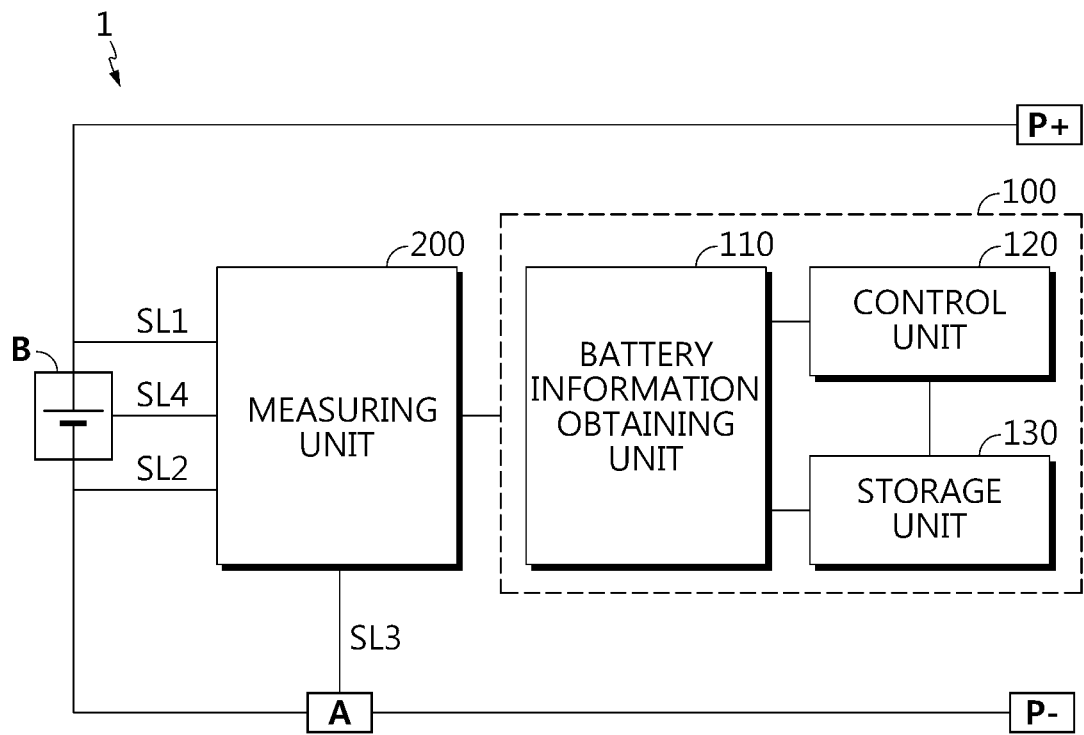
FIG. 5 is a diagram schematically showing an exemplary configuration of a battery pack according to another embodiment of the present disclosure.

FIG. 5 is a diagram schematically showing an exemplary configuration of a battery pack 1 according to another embodiment of the present disclosure.

Specifically, in the embodiment of FIG. 5, the measuring unit 200 may be connected to a first sensing line SL1, a second sensing line SL2, and a third sensing line SL3. The measuring unit 200 may be connected to a positive electrode terminal of the battery B through the first sensing line SL1, and may be connected to a negative electrode terminal of the battery B through the second sensing line SL2. In addition, the measuring unit 200 may measure the voltage of the battery B by calculating a difference between the voltage measured through the first sensing line SL1 and the voltage measured through the second sensing line SL2. While the battery B is being charged at a charging C-rate, the measuring unit 200 may measure the charging voltage of the battery B through the first sensing line SL1 and the second sensing line SL2. Conversely, while the battery B is being discharged at a discharging C-rate, the measuring unit 200 may measure the discharging voltage of the battery B through the first sensing line SL1 and the second sensing line SL2.

In addition, the measuring unit 200 may be connected to an ampere meter A through the third sensing line SL3 to measure a charging current and a discharging current of the battery B. Here, the battery B may be charged with a constant current at a charging C-rate or discharged with a constant current at a discharging C-rate.

For example, the ampere meter A may be a current sensor or shunt resistor that is provided on a charging and discharging path of the battery B to measure the charging and discharging current of the battery B. Here, the charging and discharging path of the battery B may be a large current path in which the charging current is applied to the battery B or the discharging current is output from the battery B. In the embodiment of FIG. 5, the ampere meter may be connected between a negative electrode terminal of the battery B and a negative electrode terminal P− of a battery pack 1 on the charging path of the battery B. However, it should be noted that the ampere meter may also be connected between a positive electrode terminal of the battery B and a positive electrode terminal P+ of the battery pack 1 as long as it is on the discharging path of the battery B.

Also, the measuring unit 200 may measure the temperature of the battery B through a fourth sensing line SL4.

The battery information including at least one of current, voltage, and temperature of the battery B measured by the measuring unit 200 may be transmitted to the battery management apparatus 100. For example, the battery information transmitted from the measuring unit 200 may be stored in the storage unit 130, or may be directly transmitted to the battery information obtaining unit.

Figure 6:
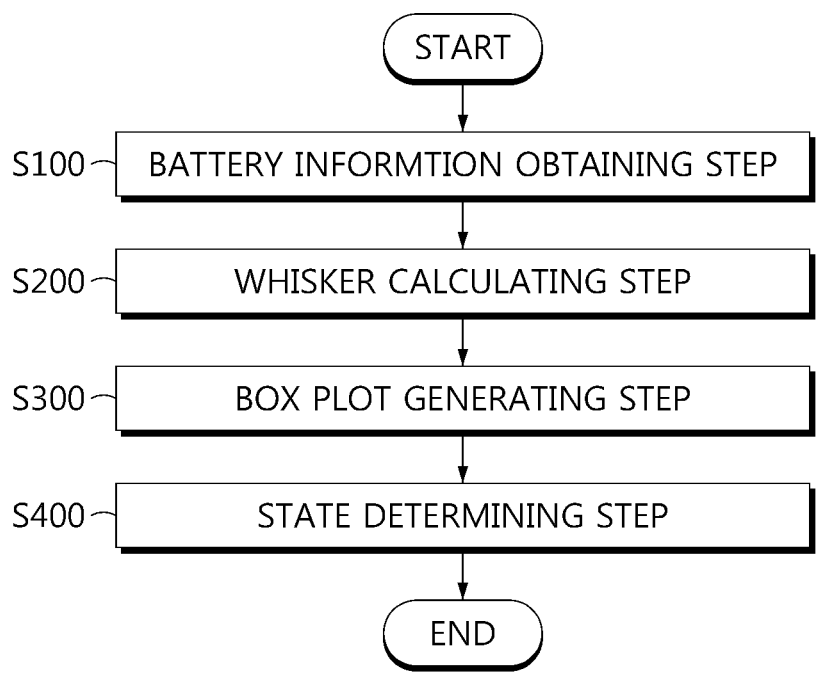
FIG. 6 is a diagram schematically showing a battery management method according to still another embodiment of the present disclosure.

FIG. 6 is a diagram schematically showing a battery management method according to still another embodiment of the present disclosure.

Preferably, each step of the battery management method may be performed by the battery management apparatus 100. Hereinafter, contents overlapping with the previously described contents will be omitted or briefly described.

Referring to FIG. 6, the battery management method may include a battery information obtaining step (S100), a whisker calculating step (S200), a box plot generating step (S300), and a state determining step (S400).

The battery information obtaining step (S100) is a step of obtaining a plurality of battery information for a plurality of battery cells, and may be performed by the battery information obtaining unit 110.

The whisker calculating step (S200) is a step of calculating a whisker for the plurality of battery information based on a criterion distribution profile for a population of the plurality of battery cells, and may be performed by the control unit 120.

For example, it is assumed that the defective rate of the population is 0.7% in the embodiment of FIG. 4. The control unit 120 may calculate the whisker by substituting a threshold deviation Td and a reference deviation Rd in the criterion distribution profile into the formula.

The box plot generating step (S300) is a step of generating a box plot for the plurality of battery cells based on the plurality of battery information and the calculated whisker, and may be performed by the control unit 120.

For example, in the embodiment of FIG. 4, the control unit 120 may generate a box plot for the plurality of battery cells according to the whisker calculated to correspond to the criterion distribution profile.

The state determining step (S400) is a step of determining the state of each of the plurality of battery cells according to whether each of the plurality of battery information is included in a threshold region corresponding to the generated box plot, and may be performed by the control unit 120.

For example, in the embodiment of FIG. 4, the control unit 120 may determine the state of a battery cell whose battery information belongs to the threshold region of the box plot as a normal state. Conversely, the control unit 120 may determine the state of a battery cell whose battery information does not belong to the threshold region of the box plot as a defective state.

In addition, according to the above embodiment, since the threshold region of the box plot may be determined to correspond to the type of the battery information, the control unit 120 may more quickly determine the state of the plurality of battery cells according to the type of the battery information.

The embodiments of the present disclosure described above may not be implemented only through an apparatus and a method, but may be implemented through a program that realizes a function corresponding to the configuration of the embodiments of the present disclosure or a recording medium on which the program is recorded. The program or recording medium may be easily implemented by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

1: battery pack
100: battery management apparatus
110: battery information obtaining unit
120: control unit
130: storage unit
200: measuring unit

What is claimed is:
1. A battery management apparatus, comprising:
 a battery information obtaining unit configured to obtain a plurality of battery information for a plurality of battery cells; and a control unit configured to:
  calculate a whisker for the plurality of battery information based on a criterion distribution profile for a population of the plurality of battery cells,
  generate a box plot for the plurality of battery cells based on the plurality of battery information and the calculated whisker, and
  determine a state of each of the plurality of battery cells according to whether each of the plurality of battery information is included in a threshold region corresponding to the generated box plot,
wherein batteries with battery information that are outside the threshold region are determined to be defective,
wherein the control unit is configured to calculate the whisker based on an average value of the criterion distribution profile, a reference value corresponding to a predetermined probability density from the average value and a threshold value set to correspond to a defective rate for the population of the plurality of battery cells, and
wherein the battery management apparatus is configured to control a charging and/or discharging of each of the plurality of battery cells based on the determined state of each of the plurality of battery cells.

2. The battery management apparatus according to claim 1,
wherein the criterion distribution profile is a profile representing a distribution pattern of the battery information for a plurality of batteries in a beginning of life (BOL) state included in the population.

3. The battery management apparatus according to claim 1,
wherein the control unit is further configured to calculate a reference deviation between the reference value and the average value, calculate a threshold deviation between the threshold value and the reference value, and calculate the whisker based on the calculated reference deviation and the calculated threshold deviation.

4. The battery management apparatus according to claim 3,
wherein the control unit is configured to calculate the whisker using the following formula:

$$W = Td + (2 \times Rd)$$ [Formula]

where W is the whisker, Td is the threshold deviation, and Rd is the reference deviation.

5. The battery management apparatus according to claim 1,
wherein the defective rate is set to correspond to a ratio of defective cells among the plurality of battery cells included in the population.

6. The battery management apparatus according to claim 1,
wherein the control unit is configured to determine the state of a battery cell whose corresponding battery information is included in a threshold range of the generated box plot among the plurality of battery cells as a normal state, and
wherein the control unit is configured to determine the state of a battery cell whose corresponding battery information is out of the threshold range of the generated box plot among the plurality of battery cells as a defective state.

7. The battery management apparatus according to claim 6,
wherein the control unit is further configured to select at least one of a top region and a bottom region included in the generated box plot according to the obtained battery information, and determine the threshold region based on the selected region.

8. A battery pack, comprising the battery management apparatus according to claim 1.

9. A battery management method, comprising:
  obtaining a plurality of battery information for a plurality of battery cells;
  calculating a whisker for the plurality of battery information based on a criterion distribution profile for a population of the plurality of battery cells;
  generating a box plot for the plurality of battery cells based on the plurality of battery information and the calculated whisker;
  determining a state of each of the plurality of battery cells according to whether each of the plurality of battery information is included in a threshold region corresponding to the generated box plot; and
  controlling a charging and/or discharging of each of the plurality of battery cells based on the determined state of each of the plurality of battery cells,
wherein batteries with battery information that are outside the threshold region are determined to be defective, and
wherein the calculating the whisker is based on an average value of the criterion distribution profile, a reference value corresponding to a predetermined probability density from the average value and a threshold value set to correspond to a defective rate for the population of the plurality of battery cells.

10. The battery management method of claim 9, wherein the box plot includes an upper inner fence and a lower inner fence, and
wherein the threshold region is disposed at or in between the upper inner fence and the lower inner fence.

11. The battery management method of claim 10, wherein an end of the threshold region corresponds to either the upper inner fence or the lower inner fence of the box plot.

* * * * *